(12) United States Patent
Farooq et al.

(10) Patent No.: US 8,822,141 B1
(45) Date of Patent: Sep. 2, 2014

(54) FRONT SIDE WAFER ID PROCESSING

(71) Applicant: International Business Machines Corporation, Armonk, NY (US)

(72) Inventors: Mukta G. Farooq, Hopewell Junction, NY (US); Robert Hannon, Wappingers Falls, NY (US); Subramanian S. Iyer, Mount Kisco, NY (US); Kevin S. Petrarca, Newburgh, NY (US); Stuart A. Sieg, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/785,816

(22) Filed: Mar. 5, 2013

(51) Int. Cl.
*G03F 7/20* (2006.01)
(52) U.S. Cl.
USPC .......................................... 430/323; 430/314
(58) Field of Classification Search
None
See application file for complete search history.

(56) References Cited

U.S. PATENT DOCUMENTS

| | | | |
|---|---|---|---|
| 4,825,093 A | 4/1989 | Kiriseko et al. | |
| 5,877,064 A | 3/1999 | Chang et al. | |
| 6,312,876 B1 * | 11/2001 | Huang et al. | 430/323 |
| 6,544,804 B2 | 4/2003 | Yano et al. | |
| 6,666,337 B1 | 12/2003 | Conboy et al. | |
| 6,710,364 B2 | 3/2004 | Guldi et al. | |
| 7,192,791 B2 | 3/2007 | Hofmeister | |
| 7,372,150 B2 | 5/2008 | Choi et al. | |
| 7,510,124 B2 | 3/2009 | Barker et al. | |
| 8,233,696 B2 | 7/2012 | Barker | |
| 2006/0228651 A1 * | 10/2006 | Tajima et al. | 430/312 |
| 2009/0057837 A1 | 3/2009 | Marshall et al. | |
| 2012/0056315 A1 * | 3/2012 | Chang et al. | 257/737 |

FOREIGN PATENT DOCUMENTS

| | | |
|---|---|---|
| JP | 02213115 | 8/1990 |
| JP | 2004119651 | 4/2004 |
| KR | 100781458 B1 | 12/2007 |

* cited by examiner

*Primary Examiner* — John A. McPherson
(74) *Attorney, Agent, or Firm* — Edward P. Li; Jason H. Sosa

(57) ABSTRACT

A method for printing a wafer ID on a wafer, the method comprises identifying a wafer ID on a back side of the wafer. Subsequently, etching a plurality of recesses, consistent in size with chip features of the wafer, into the front side of the wafer, such that the plurality of recesses depicts the wafer ID. The method further comprises filling the recesses with a metal.

12 Claims, 5 Drawing Sheets

FRONT SIDE WAFER ID PROCESSING

FIELD OF THE INVENTION

The present invention relates generally to manufacture of semiconductors, and more particularly to enabling tracking of wafer components through processing of 3D chips.

BACKGROUND

Wafers are generally used as a foundation for building semiconductor devices. During manufacturing of semiconductor devices, an identifier, referred to herein as a wafer ID, is usually formed on a semiconductor wafer. In conventional wafers, the devices and interconnect metallization are formed on one side of a wafer, e.g., the "front side." It is conventional to form the wafer ID on the opposite side, e.g., the "back side." As scaling becomes more challenging, processing the back sides of wafers is often needed, for example in three dimensional integrated (3Di) chips. Processing back sides of wafers, e.g., thinning, grinding, polishing, etc., however, can cause the wafer IDs to be removed.

SUMMARY

One embodiment of the present invention provides a method for placing a wafer ID of a back side on a front side of a wafer. The method comprises reading from the back side of the wafer the wafer ID; patterning the wafer ID in an etch mask on the front side of the wafer, wherein each character of the wafer ID patterned into the etch mask includes a plurality of openings substantially matching feature sizes of fabricated chip features on the wafer; etching the front side of the wafer through the plurality of openings in the etch mask to produce a plurality of recesses in the wafer that collectively depict the wafer ID; and filling the plurality of recesses in the wafer with a metal.

Another embodiment of the present invention provides a method for printing a wafer ID on a wafer. The method comprises identifying a wafer ID for a wafer; patterning a mirror image of the wafer ID into an etch mask over a front side of the wafer; patterning one or more TSV designs into the etch mask in addition to the mirror image of the wafer ID; etching the mirror image of the wafer ID and the one or more TSV designs into the wafer to a given depth; filling the etched minor image of the wafer ID and one or more TSV designs with a metal; and thinning a back side of the wafer to expose the metal within the etched minor image of the wafer ID and one or more TSV designs, such that the metal within the etched mirror image of the wafer ID presents as a non-mirrored depiction of the wafer ID when viewed from the back side of the wafer.

DETAILED DESCRIPTION

The present invention discloses a method for placing a wafer ID of a back side on a front side of a wafer. The method of the present invention is described in detail in the following exemplary embodiments with reference to the figures. The foregoing description of various exemplary embodiments of the present invention has been presented for purposes of illustration and description. It is neither intended to be exhaustive nor to limit the invention to the precise form disclosed. Many modifications and variations are possible. Such modifications and variations that may be apparent to a person skilled in the art of the invention are intended to be included within the scope of the invention as defined by the accompanying claims.

It is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

Figure 1:
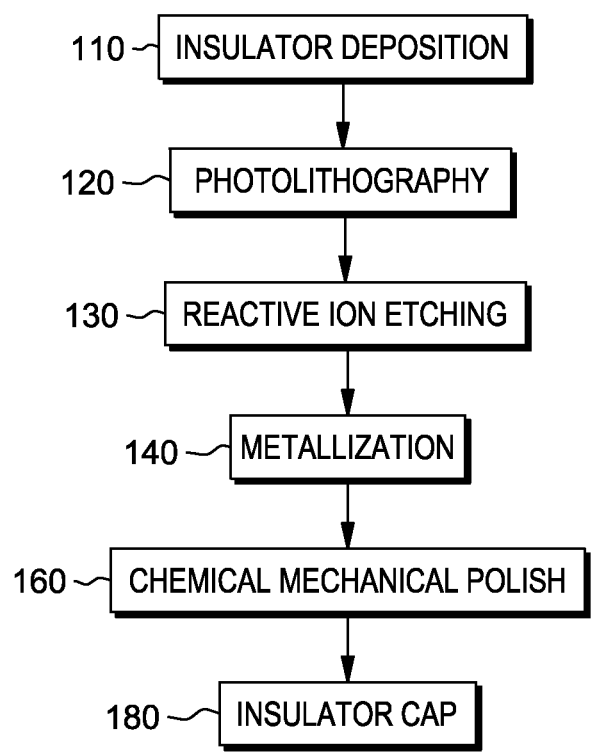
FIG. 1 illustrates a wafer processing sequence, in accordance with an embodiment of the present invention.

To facilitate description of a method for placing a wafer ID of a back side on a front side of a wafer, FIG. 1 illustrates a wafer processing sequence. The exemplary process can be implemented by one or more tools that are conventional in the art of wafer manufacture. And, wafers are semiconductor wafers of conventional materials used in the art. Step 110 of the exemplary process is insulator deposition. At step 110, the insulator, such as $SiO_2$, SiN, SiC, and etc, is deposited on the wafers through chemical vapor deposition (CVD), such as plasma-enhanced chemical vapor deposition (PECVD), atomic layer deposition (ALD), or sub-atmospheric pressure chemical vapor deposition (SACVD). Step 120 of the exemplary process is photolithography. Photolithography is a process used in microfabrication to pattern parts of a thin film or the bulk of a substrate. It uses light to transfer a geometric pattern from a photomask to a light-sensitive chemical "photoresist" on the substrate, thereby exposing the underlying substrate or insulation layer in the shape of the geometric pattern. The remaining photoresist protects the unexposed portions of the underlying layer in subsequent etching processes, e.g. reactive-ion etching (RIE), allowing the geometric pattern to be removed from the underlying layer. Step 130 of the exemplary process is reactive ion etching. RIE uses chemically reactive plasma to remove material deposited on wafers. The plasma is generated under low pressure (vacuum) by an electromagnetic field. High-energy ions from the plasma attack the wafer surface (where exposed) and react with it. It should be noted that when etching features that are of different sizes, as determined by the openings through the photoresist, RIE "lag" can happen. This is generally characterized as a differential in etch depths due to the difference of the resist size opening. Step 140 of the exemplary process is metallization. Metallization is the process that connects individual devices together by means of microscopic wires to form circuits on the wafers. For example, trenches patterned in step 120 and etched in step 130 can be filled with a metal or other conductive material to form a wire. Step 160 of the exemplary process is chemical mechanical polishing. Chemical mechanical polishing (CMP) is a process of smoothing surfaces of the wafers with the combination of chemical and mechanical forces. Often metal-filled trenches are overfilled and excess metal is removed using a CMP process. Steps 110 through 160 can be repeated to form a plurality of stacked layers with various chip design features. Step 180 of the exemplary process is insulator cap deposit. The insulator caps, typically SiN or NBlok, are deposited on the wafer through chemical vapor deposition (CVD). The insulator caps are materials that not only insulate against electrical passage but also prevent copper or other metals from defusing through them. A method for placing a wafer ID of a back side on a front side of a wafer is incorporated in the exemplary process shown in FIG. 1, and the method is discussed in detail in later paragraphs with reference to FIGS. 2-9.

Figure 2:
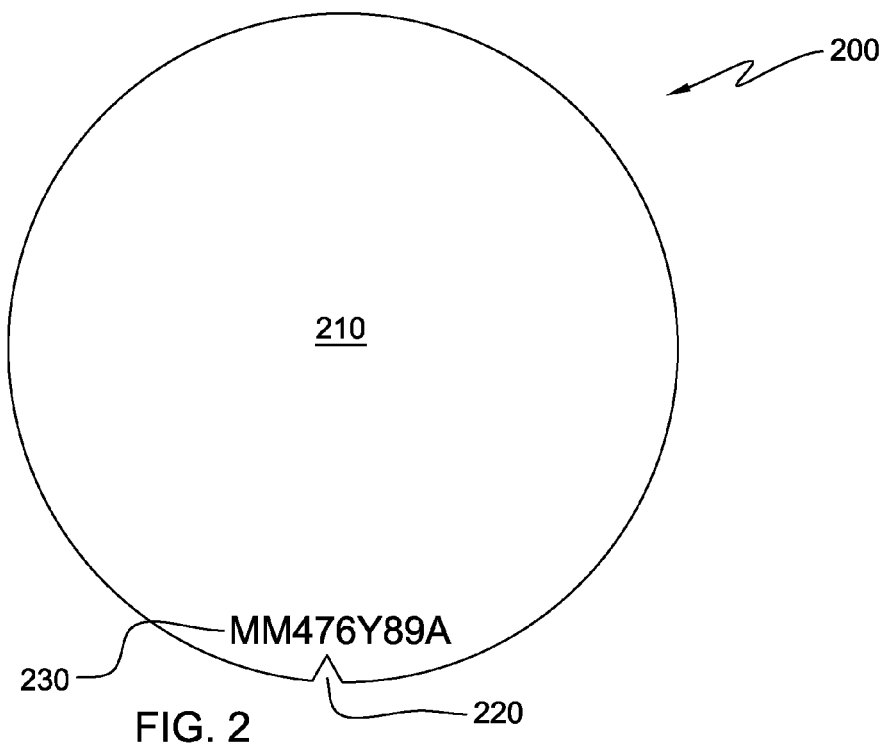
FIG. 2 illustrates a wafer ID on a back side of a wafer, in accordance with an embodiment of the present invention.
Figure 3:
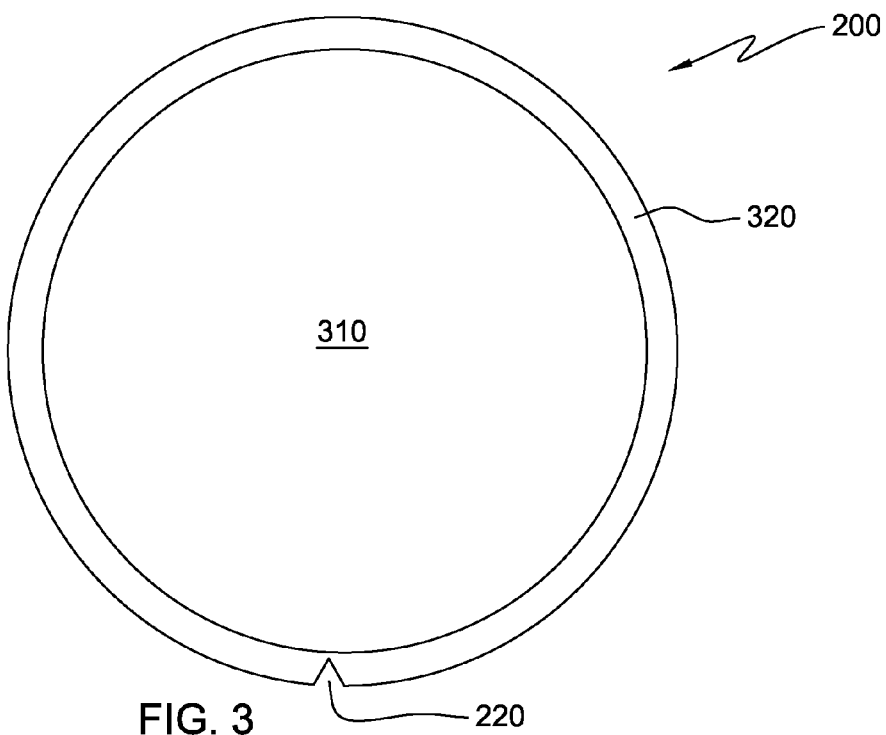
FIG. 3 illustrates a front side of a wafer, in accordance with an embodiment of the present invention.

FIG. 2 is a diagram illustrating wafer ID 230 on back side 210 of wafer 200, in accordance with an exemplary embodiment of the present invention. Wafer 200 is a semiconductor wafer of a conventional material used in the art of the semiconductor industry. In one embodiment, wafer 200 may include orientation notch 220. Generally, wafer ID 230 is placed on back side 210 and is readily identified throughout processes of manufacturing the semiconductor devices. However, due to the processes of grinding and polishing back side 210 of wafer 200, wafer ID 230 thereon is removed. For example, in 3D chip technology, electrical connections may pass from one side of a wafer or chip, through the substrate, to the opposite side of the wafer or chip. These connections are generally referred to as through-silicon vias (TSVs), though in various instances may pass through substrate material other than silicon. The process of creating a TSV typically involves etching an opening into the substrate that does not reach the other side of the substrate, depositing a conductive material into the opening, e.g., copper, and "thinning" the other side of the substrate to expose the conductive material such that it passes completely through the substrate. Thinning can include grinding, polishing, etc., and will typically remove the wafer ID. Therefore, placing wafer ID 230 somewhere else on wafer 200 other than back side 210 may be beneficial when excessive backside processing occurs. FIG. 3 is a diagram illustrating a front side of wafer 200, in accordance with an exemplary embodiment of the present invention. Photoresist 310, which is a light-sensitive material, is on the front side of wafer 200. The peripheral part of the front side of wafer 200 is edge 320 where the light sensitive material (photoresist) is chemically and/or lithographically removed.

Figure 4A:
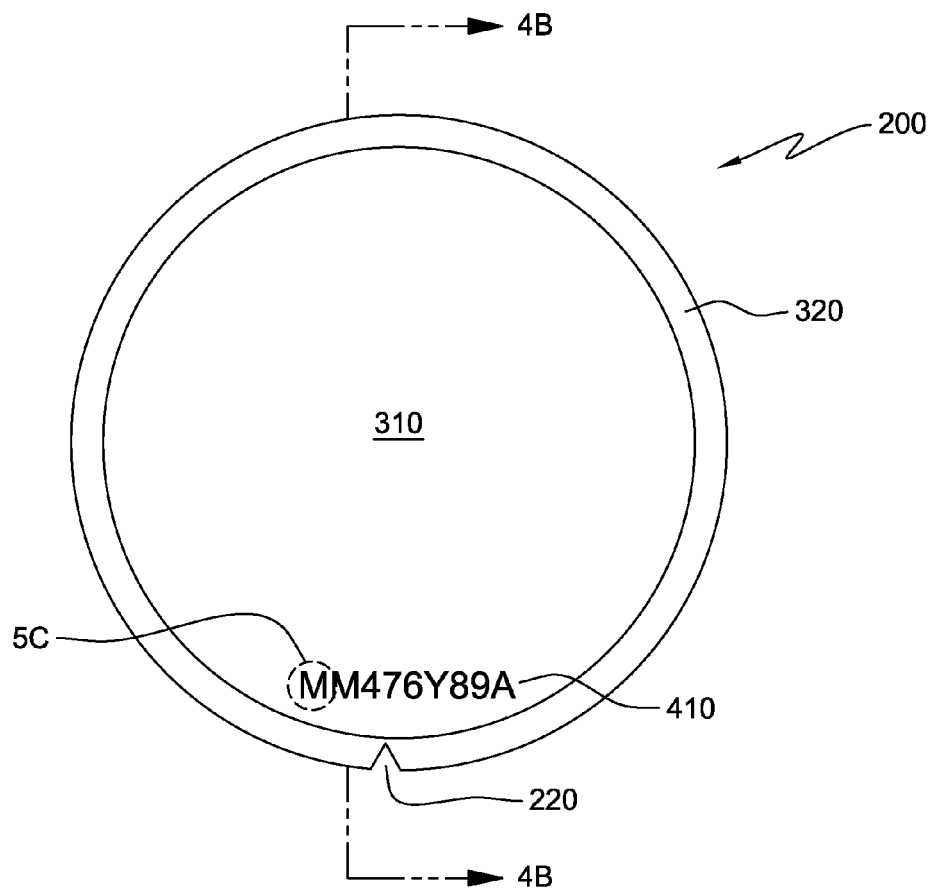
FIG. 4A illustrates printing the wafer ID of the back side shown in FIG. 2, into an etch mask on the front side shown in FIG. 3, in accordance with an embodiment of the present invention.
Figure 4B:
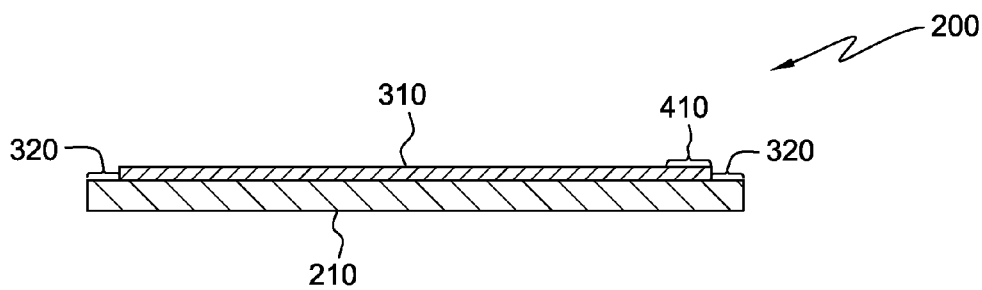
FIG. 4B illustrates a sectional view of the wafer, which is a view of 4B-4B section shown in FIG. 4A, in accordance with an embodiment of the present invention.

FIG. 4A is a diagram illustrating that wafer ID 230 of back side 210 of wafer 200 shown in FIG. 2 is printed in photoresist 310 on the front side of wafer 200 shown in FIG. 3, in accordance with an exemplary embodiment of the present invention. FIG. 4B is a diagram illustrating a sectional view of wafer 200, which is a view of 4B-4B section shown in FIG. 4A. FIGS. 4A and 4B shows wafer ID 410 printed in photoresist 310 on the front side of wafer 200. Wafer ID 410 on the front side carries the information of wafer ID 230 of back side 210 of wafer 200. In the exemplary process (shown in FIG. 1) of manufacturing wafers, when the earlier mentioned one or more tools read wafer ID 230 of back side 210 of wafer 200, the information is transferred to a printing system of the one or more tools. Then, the printing system prints wafer ID 230 in photoresist 310 on the front side of wafer 200. Thus, wafer ID 230 of back side 210 of wafer 200 is copied onto the front side of wafer 200, and wafer 200 has wafer ID 410 printed in photoresist 310 on the front side. To print wafer ID 410 in photoresist 310, the printing system uses an attenuated beam of light, for example, ultraviolet (UV) or laser; the printing system may also use an electron beam. In FIG. 4A, an image of wafer ID 230 of back side 210 of wafer 200 is printed as wafer ID 410 on the front side of wafer 200. Thus, wafer ID 410 can be read optically from the front side of wafer 200 during processes of manufacturing the semiconductor devices, for the purpose of tracking wafer 200.

In the exemplary embodiment, the process of printing wafer ID 410 may be incorporated into standard processing steps as described with regard to FIG. 1. For example, photolithography described with respect to step 120, may pattern the wafer ID in addition to one or more other features. As depicted, photoresist 310 has been exposed to reveal edge 320. In one embodiment, the same exposure can be used to remove the pattern of wafer ID 410 in photoresist 310. Often, a Wafer Edge Expose (WEE) process is used to track a wafer edge and, accordingly, to expose the edge. The WEE process may, in one embodiment, be adjusted to expose the wafer ID into the photoresist just inside the exposed edge. In another embodiment, printing wafer ID 410 may be incorporated in the patterning and etching of a wiring layer or metal layer, e.g., the final metal layer. Patterning a photoresist with both the wafer ID and wiring features would allow both to be etched, and subsequently filled, concurrently, thereby avoiding additional processing steps. Alternatively, wafer 200 may be moved to a specially made piece of equipment, and reading wafer ID 230 and printing wafer ID 410 are completed in a stand alone process.

Figure 5A:
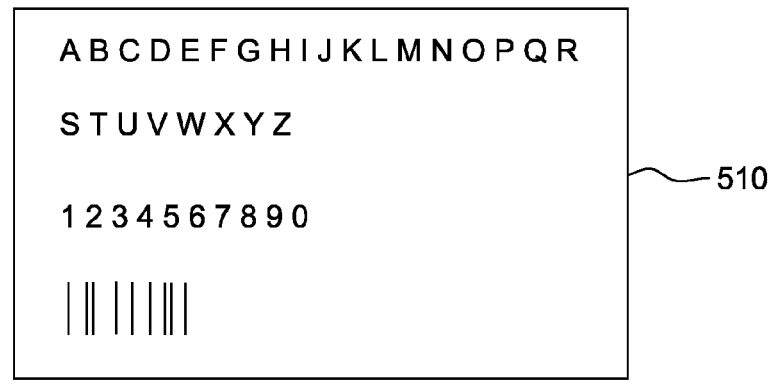
FIGS. 5A and 5B illustrates a printing system used in printing a wafer ID in the etch mask on the front side shown in FIG. 3, in accordance with an embodiment of the present invention.
Figure 5B:
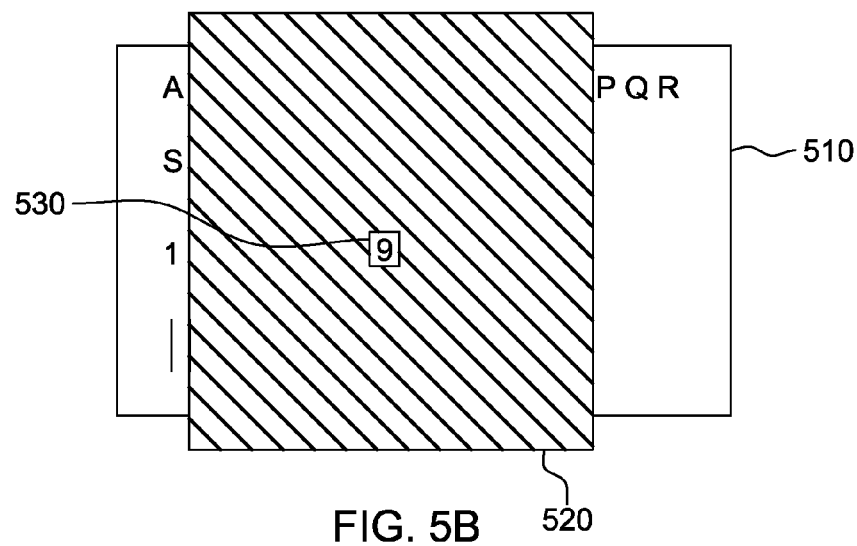

In an embodiment shown in FIGS. 5A and 5B, printing wafer ID 410 in photoresist 310 on a front side of wafer 200 is implemented using reticle 510 shown in FIG. 5A and blocking plate 520 shown in FIG. 5B. The term "reticle" is commonly used in the case of projection printing in the semiconductor industry. A reticle is a square quartz plate with a pattern delineated in thin chrome layer on one side, and it is functionally the same as a mask. Reticle 510 comprises alphanumerical and/or barcode characters. Blocking plate 520 comprises hole 530 that allows a light beam to pass through. To print wafer ID 410 in photoresist 310 on the front side of wafer 200, respective characters selected from alphanumerical and/or barcode characters on reticle 510 are aimed at where wafer ID 410 is to be printed, blocking plate 520 is so adjusted that hole 530 is pointed at the respective characters. For example, in FIG. 5B, hole 530 is aimed at number 9 on reticle 510. When the light beam is passed through hole 530, the respective characters are exposed in photoresist 310 on the front side of wafer 200. Thus, wafer ID 410 is printed in photoresist 310 on the front side of wafer 200. Again, wafer ID 410 may, in one embodiment, be patterned into photoresist 310 in addition to features such as trench and/or via patterns.

Figure 5C:
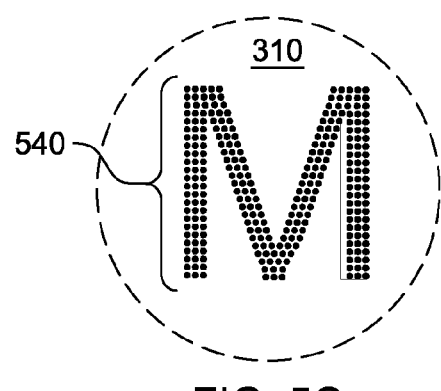
FIG. 5C depicts a character of the wafer ID patterned into the etch mask as a plurality of openings according to an embodiment of the present invention.

In another embodiment, to account for RIE lag (the differential in etch depths due to the difference of the resist size opening), the wafer ID can be segmented into parts that will mimic the feature sizes of the chip printing. For example, if the feature size in the chip is 6μ, then the wafer ID characters could be made of a plurality 6μ vias or bars (comparable to dot-matrix printing). Thereby, matching the sizes to avert the RIE differential depths while preserving the quality of the wafer ID without compromising the integrity of the chip features. A person of ordinary skill in the art will recognize that an exact match of feature size, e.g. 6μ to 6μ, though preferred, is not necessary, and that a substantial match (i.e. within a twenty percent range of feature size) may also provide similar benefits. In one implementation of such an embodiment, reticles used to pattern wafer ID characters into photoresist 310 may be comprised of a plurality of openings substantially matching feature sizes of the chip. FIG. 5C depicts a character (540) of wafer ID 410 patterned into photoresist 310 according to such a technique.

In another exemplary embodiment, a mirrored image of wafer ID 230 of back side 210 of wafer 200 is printed on the front side of wafer 200. Wafer ID 410 on the front side is a mirrored image of wafer ID 230. Depending on the material used to fill the etched mirrored wafer ID, for example copper, wafer ID 410 can be viewed and read from the opposite side of the chip using infrared. Thus, printing a mirrored image of the wafer ID allows the wafer ID to be read correctly from the backside. Additionally, prior to metal deposition of a wafer ID, the wafer ID may be etched to varying depths. In one embodiment, wafer ID 410 is etched to a depth at least equaling the depth of TSVs in the wafer. Subsequent thinning processes to expose the TSVs would thereby simultaneously expose wafer ID 410 on the back side of wafer 200. A mirrored image etched and deposited on the front side would thereby produce a correct image as exposed from the back side.

Current TSVs typically range anywhere from 5 to 25 microns in diameter and can be etched into a chip or wafer as deep as 100 microns depending on the ultimate desired thickness of the chip or wafer. One preferred thickness, and therefore a standard TSV etch depth, is 55 microns. Characters of wafer ID 410, or in one embodiment the plurality of holes or openings making up characters of wafer ID 410, may be etched through a mask to match the depth of the TSVs. In one embodiment, this may be done simultaneously with the etching of the TSV openings. Both the TSV openings and the characters of wafer ID 410 are filled, preferably with the same material during the same deposition step to prevent additional processing steps.

Figure 6:
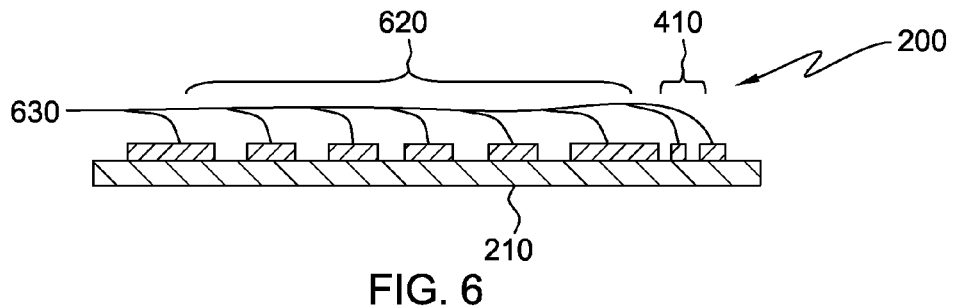
FIG. 6 illustrates a sectional view of a wafer with a printed wafer ID on a front side of a wafer after a photolithography process, in accordance with an embodiment of the present invention.

FIG. 6 is a diagram illustrating a sectional view of wafer 200 with wafer ID 410 on a front side of wafer 200 after the step of photolithography 120 shown in FIG. 1, in accordance with an exemplary embodiment of the present invention. After the step of photolithography 120, wafer 200 has exposure patterns including wafer ID 410 and chip feature 620 on the front side. FIG. 6 also shows remaining photoresist 630 on the front side of wafer 200. As depicted, wafer ID 410 and chip features 620 may be patterned into the same photoresist. Though the process is discussed herein with reference to patterning a photoresist for subsequent etching steps, a person of ordinary skill in the art will recognize that any etch mask may be used, including a hard mask such as titanium nitride, silicon nitride, silicon dioxide, silicon carbide, silicon carbide nitride and/or combinations of the preceding.

Figure 7:
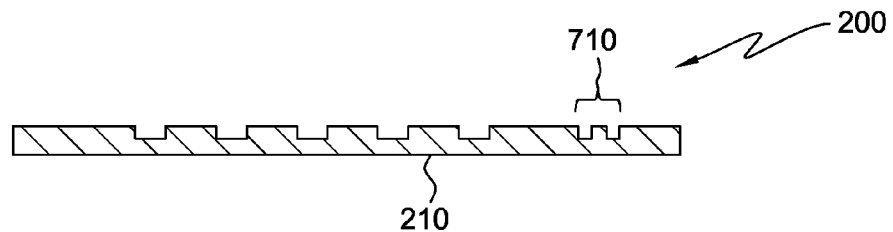
FIG. 7 illustrates a sectional view of a wafer with an etched wafer ID on a front side of a wafer after a reactive ion etching process, in accordance with an embodiment of the present invention.

FIG. 7 is a diagram illustrating a sectional view of wafer 200 with etched wafer ID 710 on a front side after the step of reactive ion etching 130 shown in FIG. 1, in accordance with an exemplary embodiment of the present invention. Through the step of reactive ion etching 130, wafer ID 410 and chip feature 620 are etched into wafer 200, preferably at the same time. Wafer ID 410 is engraved as etched wafer ID 710 on the front side of wafer 200. Though the etch process is preferably an anisotropic RIE, in other embodiments, other anisotropic etching methods (ion beam etching, plasma etching, laser ablation, etc.), or isotropic etching methods (wet chemical etch, etc.) may be used.

Figure 8:
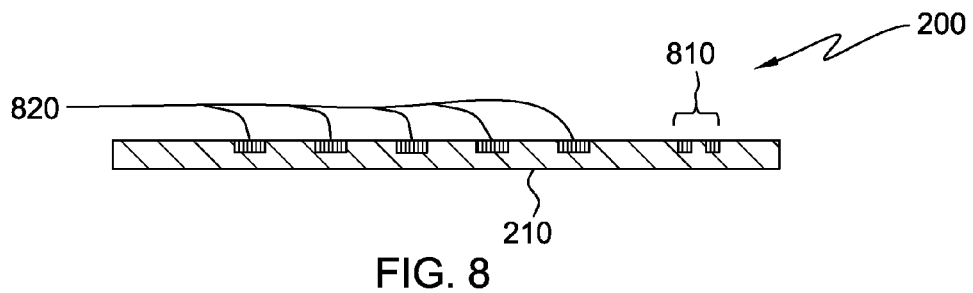
FIG. 8 illustrates a sectional view of a wafer with a metal-filled wafer ID on a front side of a wafer after a metallization process, in accordance with an embodiment of the present invention.

FIG. 8 is a diagram illustrating a sectional view of wafer 200 with metal-filled wafer ID 810 on a front side after the step of metallization 140 shown in FIG. 1, in accordance with an exemplary embodiment of the present invention. Through the step of metallization 140, etched wafer ID 710 shown in FIG. 7 is filled with a metal, and metal-filled wafer ID 810 is formed on the front side of wafer 200; chip feature 620 on the front side shown in FIG. 6 is filled with a metal, and metal-filled chip feature 820 is formed on the front side of wafer 200. It should be noted that placing a back side wafer ID on a front side of a wafer can also be performed at the last metal level which is commonly aluminum. This would form the wafer ID at the upper portion of the wafer structure. Since aluminum feature fabrication uses a subtractive etch instead of a damascene process, in such an embodiment, the aluminum may not be initially embedded in the insulator when formed. This process is well known and may be apparent to a person skilled in the art.

Figure 9:
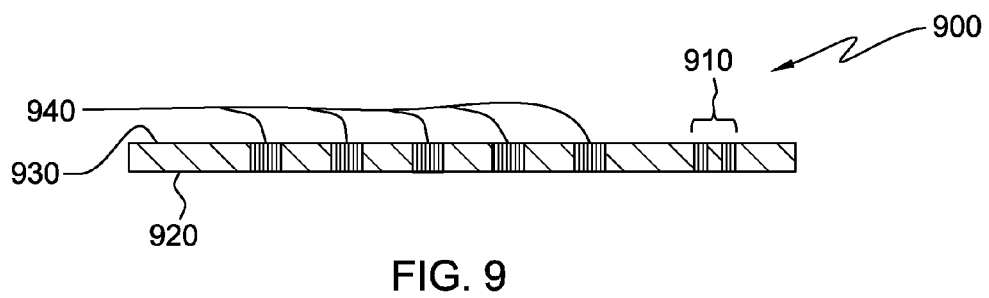
FIG. 9 illustrates a sectional view of a through-silicon-via (TSV) wafer with a metal-filled wafer ID, in accordance with an embodiment of the present invention.

FIG. 9 is a diagram illustrating a sectional view of through-silicon-via (TSV) wafer 900 with metal-filled wafer ID 910, in accordance with an exemplary embodiment of the present invention. FIG. 9 shows metal-filled through-silicon-vias 940 on through-silicon-via (TSV) wafer 900 which has front side 920 and back side 930. The sectional view in FIG. 9 shows that metal-filled wafer ID 910 is visible from both front side 920 and back side 930.

An image of a back-side wafer ID of TSV wafer 900 is placed on front side 920, so that metal-filled wafer ID 910 can be read optically from front side 920, for tracking wafer 900 during processes of manufacturing the semiconductor devices. Alternatively, a mirrored image of a back-side wafer ID of TSV wafer 900 is placed on front side 920, so that metal-filled wafer ID 910 can be read from back side 930.

Based on the foregoing, a method has been disclosed for placing a wafer ID of a back side on a front side of a wafer. However, numerous modifications and substitutions can be made without deviating from the sprit and scope of the present invention. Therefore, the present invention has been disclosed by way of examples and not limitation.

What is claimed is:

1. A method for printing a wafer ID on a wafer, the method comprising the steps of:
  identifying a wafer ID for a wafer;
  patterning the wafer ID in an etch mask on a front side of the wafer, wherein each character of the wafer ID patterned into the etch mask includes a plurality of openings substantially matching feature sizes of fabricated chip features on the wafer;
  etching the front side of the wafer through the plurality of openings in the etch mask to produce a plurality of recesses in the wafer that collectively depict the wafer ID; and
  filling the plurality of recesses in the wafer with a metal.

2. The method of claim 1, further comprising the steps of:
prior to the step etching the front side of the wafer through the plurality of openings in the etch mask, patterning one or more chip design features into the etch mask; and
etching recesses into the front side of the wafer corresponding to the one or more chip design features concurrently with the step of etching the front side of the wafer through the plurality of openings in the etch mask to produce the plurality of recesses in the wafer that collectively depict the wafer ID.

3. The method of claim 2, further comprising the step of filling the recesses corresponding to the one or more chip design features with a metal concurrently with the step of filling the plurality of recesses that collectively depict the wafer ID.

4. The method of claim 2,
wherein the one or more chip design features are through-silicon vias (TSVs); and
wherein the step of etching recesses into the front side of the wafer corresponding to the one or more chip design features concurrently with the step of etching the front side of the wafer through the plurality of openings in the etch mask to produce the plurality of recesses in the wafer that collectively depict the wafer ID, occurs such that depth of the recesses corresponding to the one or more chip design features, and the plurality of recesses in the wafer that collectively depict the wafer ID, are substantially equivalent.

5. The method of claim 4, further comprising the steps of:
filling the recesses corresponding to the one or more chip design features and the plurality of recesses in the wafer that collectively depict the wafer ID with a conductive metal; and
thinning a back side of the wafer to expose the metal-filled recesses corresponding to the one or more chip design features and the plurality of recesses in the wafer that collectively depict the wafer ID.

6. The method of claim 1,
wherein the etch mask is a photoresist; and
wherein the step of patterning the wafer ID in the etch mask comprises utilizing a wafer edge expose (WEE) process to expose the wafer ID pattern in the photoresist.

7. The method of claim 1, wherein the step of patterning the wafer ID in the etch mask comprises patterning a mirrored image of the wafer ID in the etch mask.

8. The method of claim 7, further comprising reading the wafer ID from a back side of the wafer using infrared.

9. The method of claim 7,
wherein the plurality of recesses in the wafer that collectively depict the wafer ID are at least of a depth equal to a desired thickness of the wafer, and
further comprising the step of thinning a back side of the wafer to expose the plurality of recesses from the back side of the wafer.

10. A method for printing a wafer ID on a wafer, the method comprising the steps of:
identifying a wafer ID for a wafer;
patterning a mirror image of the wafer ID into an etch mask over a front side of the wafer;
patterning one or more TSV designs into the etch mask in addition to the mirror image of the wafer ID;
etching the mirror image of the wafer ID and the one or more TSV designs into the wafer to a given depth;
filling the etched mirror image of the wafer ID and one or more TSV designs with a metal; and
thinning a back side of the wafer to expose the metal within the etched mirror image of the wafer ID and one or more TSV designs, such that the metal within the etched mirror image of the wafer ID presents as a non-mirrored depiction of the wafer ID when viewed from the back side of the wafer.

11. The method of claim 10, wherein the given depth is between 20 microns and 100 microns, inclusive.

12. The method of claim 10, wherein the given depth is between 50 and 60 microns.

* * * * *